United States Patent
Nakamura et al.

(10) Patent No.: US 7,786,652 B2
(45) Date of Patent: Aug. 31, 2010

(54) MULTI-LAYER PIEZOELECTRIC ELEMENT

(75) Inventors: Shigenobu Nakamura, Kirishima (JP);
Takafumi Tsurumaru, Kirishima (JP);
Takeshi Okamura, Kirishima (JP)

(73) Assignee: Kyocera Corporation, Kyoto (JP)

( * ) Notice: Subject to any disclaimer, the term of this patent is extended or adjusted under 35 U.S.C. 154(b) by 477 days.

(21) Appl. No.: 10/599,532

(22) PCT Filed: Mar. 29, 2005

(86) PCT No.: PCT/JP2005/005893
§ 371 (c)(1),
(2), (4) Date: Jan. 16, 2008

(87) PCT Pub. No.: WO2005/093866
PCT Pub. Date: Oct. 6, 2005

(65) Prior Publication Data
US 2008/0238264 A1 Oct. 2, 2008

(30) Foreign Application Priority Data
Mar. 29, 2004 (JP) .............................. 2004-094019
May 6, 2004 (JP) .............................. 2004-137696

(51) Int. Cl.
H01L 41/083 (2006.01)
(52) U.S. Cl. ....................... 310/328; 310/365
(58) Field of Classification Search ................. 310/328, 310/363–366
See application file for complete search history.

(56) References Cited
U.S. PATENT DOCUMENTS 5,841,626 A * 11/1998 Sano et al. ............... 361/321.5
5,935,485 A * 8/1999 Tani et al. ............. 252/62.9 PZ
6,381,118 B1 * 4/2002 Yokoyama et al. ........ 361/308.1
6,411,012 B2 6/2002 Furukawa et al.
6,700,306 B2 3/2004 Nakamura et al.
6,930,438 B2 * 8/2005 Cramer et al. .............. 310/328

(Continued)

FOREIGN PATENT DOCUMENTS

CN 1299153 A 6/2001

(Continued)

OTHER PUBLICATIONS

European office action for corresponding European application 05727644.6, date: Jan. 20, 2010.

(Continued)

Primary Examiner—J. SanMartin
(74) Attorney, Agent, or Firm—Hogan Lovells US LLP

(57) ABSTRACT

The multi-layer piezoelectric element comprises a stack having an active portion constituted from at least one piezoelectric layer and a plurality of internal electrodes consisting of first and second internal electrodes placed one on another, the active portion being subjected to expansion and contraction in response to a voltage applied across the first internal electrode and the second internal electrode, and external electrodes formed on two side faces of the stack with one thereof being connected to the first internal electrode and the other connected to the second internal electrode, wherein each of the external electrodes is constituted from three or more layers including a first layer formed in contact with the side face of the stack and a second layer formed on the first layer, to provide a multi-layer piezoelectric element having high durability.

4 Claims, 6 Drawing Sheets

U.S. PATENT DOCUMENTS

| | | | |
|---|---|---|---|
| 7,271,524 B2 | 9/2007 | Sugg | |
| 7,276,841 B2 * | 10/2007 | Takaoka et al. | 310/363 |
| 7,385,337 B2 * | 6/2008 | Mochizuki et al. | 310/365 |
| 7,439,655 B2 * | 10/2008 | Asano et al. | 310/328 |
| 7,538,475 B2 * | 5/2009 | Ohmori et al. | 310/328 |
| 2001/0009344 A1 | 7/2001 | Furukawa et al. | |
| 2001/0043454 A1 * | 11/2001 | Yoshii et al. | 361/321.2 |
| 2002/0158552 A1 * | 10/2002 | Nakamura et al. | 310/328 |
| 2006/0108898 A1 | 5/2006 | Sugg | |
| 2008/0203857 A1 * | 8/2008 | Kastl et al. | 310/359 |

FOREIGN PATENT DOCUMENTS

| | | |
|---|---|---|
| DE | 19945934 C1 | 3/2001 |
| DE | 10237589 A1 | 2/2004 |
| JP | 61-133715 | 6/1986 |
| JP | 01-130568 | 9/1989 |
| JP | 07-022557 | 4/1995 |
| JP | 07154005 A | 6/1995 |
| JP | 09-270540 | 10/1997 |

OTHER PUBLICATIONS

European search report for corresponding European application 05727644.6 lists the references above, date: Mar. 26, 2009.

* cited by examiner

MULTI-LAYER PIEZOELECTRIC ELEMENT

CROSS-REFERENCE TO THE RELATED APPLICATION

This is a national phase of PCT application No. PCT/JP2005/005893 filed Mar. 29, 2005, the entire contents of which are incorporated by reference. This application also claims benefit of priority under 35 U.S.C. §119 to Japanese Patent Application No. 2004-094019 filed Mar. 29, 2004 and Japanese Patent Application No. 2004-137696 filed May 6, 2004, the entire contents of both are incorporated by reference.

FIELD OF THE INVENTION

The present invention relates to a multi-layer piezoelectric element (may be hereinafter referred to simply as an "element") used in, for example, fuel injection apparatus of automobile engine, liquid injection apparatus of ink jet printer or the like or a drive unit used in precision positioning device or vibration preventing device for an optical apparatus, and to a multi-layer piezoelectric element used as a sensor element mounted in combustion pressure sensor, knocking sensor, acceleration sensor, load sensor, ultrasound sensor, pressure sensor, yaw rate sensor or the like, or used as a circuit component mounted in piezoelectric gyro, piezoelectric switch, piezoelectric transducer, piezoelectric breaker or the like.

BACKGROUND ART

Multi-layer piezoelectric actuators constituted from piezoelectric layers and internal electrodes stacked alternately one on another have been known. The multi-layer piezoelectric actuators can be divided into two categories: fired-at-once type and stacked type which has such a constitution as piezoelectric porcelain made of a piezoelectric material and internal electrodes having the form of sheet are stacked one on another alternately. When the requirements to reduce the operating voltage and the manufacturing cost are taken into consideration, the multi-layer piezoelectric actuator of fired-at-once type is more advantageous for the reason of smaller layer thickness and higher durability.

FIG. 7 shows a multi-layer piezoelectric element of the prior art disclosed in Patent Document 1, which is constituted from a stack 20 and external electrodes 54 formed on a pair of opposing side faces thereof. The stack 20 is formed by stacking piezoelectric layers 51 and internal electrodes 52 alternately one on another. The internal electrodes 52 are not formed over the entire principal surfaces of the piezoelectric layers 51, but are formed in a so-called partial electrode structure. In the stack of the partial electrode structure, the internal electrodes 52 are stacked in a staggered manner so as to be exposed on the side face of the stack 20 alternately at the left in one layer and then at the right in the next layer. The external electrodes 54 are formed so as to be connected to the internal electrode 52 that is exposed on either of a pair of opposing side faces of the stack 20 in every other layer.

Inactive layers 62 are stacked on both end faces of the stack 20 in the direction of stacking. The inactive layer 62 is also called the protective layer, and normally does not include the electrode 51. This constitution involves such a problem that a portion including the internal electrode layer 52 and the inactive layer 62 shrink to different degrees during firing, thus resulting in stress and/or cracks generated therein. To counter this problem, as shown in FIG. 8, Patent Document 3 discloses means for preventing cracks from occurring after firing, by stacking an electrode layer 61 that is similar to an active layer 63 on the inactive layer 62. A portion including the internal electrode layer 52 that is connected to the external electrode is called the active layer since it expands and contracts in response to the application of voltage.

The multi-layer piezoelectric element having the constitution described above is manufactured as follows. First, a paste for the internal electrode is printed in a predetermined pattern of the electrode structure on a plurality of ceramic green sheets that include the substance used for making the piezoelectric material 51, and are stacked and fired so as to form the stack 20. Then the external electrodes 54 are formed on a pair of side faces of the stack 20 thereby to make the multi-layer piezoelectric element (refer to, for example, Patent Document 1).

The internal electrode 52 is formed from an alloy of silver and palladium and, in order to fire the piezoelectric layers 51 and the internal electrodes 52 at the same time, composition of metals included in the internal electrode 52 has been set typically to 70% by weight of silver and 30% by weight of palladium (refer to, for example, Patent Document 2).

The reason for using the internal electrode 52 made of a metal compound that includes silver-palladium alloy instead of the internal electrode 52 having composition constituted from pure silver is that, when a voltage is applied between a pair of opposing internal electrodes 52, the composition constituted from pure silver suffers from the so-called silver migration in which silver atoms migrate from the positive electrode to the negative electrode of the pair of internal electrodes 52 along the device surface. Silver migration occurs conspicuously particularly in an atmosphere of high temperature and high humidity.

When the multi-layer piezoelectric element of the prior art is used as a piezoelectric actuator, lead wires (not shown) are secured onto the external electrodes 54 by soldering, and a predetermined voltage is applied across the external electrodes 54 to operate the device. In recent years, it is a common practice to operate the multi-layer piezoelectric element continuously over a long period of time, since it is required to achieve a large amount of displacement from a compact multi-layer piezoelectric element under a higher pressure.

Patent Document 1: Japanese Unexamined Patent Publication (Kokai) No. 61-133715
Patent Document 2: Japanese Unexamined Utility Model Publication (Kokai) No. 1-130568
Patent Document 3: Japanese Unexamined Patent Publication (Kokai) No. 9-270540

DISCLOSURE OF THE INVENTION

However, there have been such problems in the multi-layer piezoelectric element as described below, since the active layer expands and contracts while the external electrodes and the inactive layers that are formed around the active layer do not expand or contract.

First, since the active layer experiences repetitive changes in the dimension during operation, peel-off between the external electrode and the piezoelectric layer and/or crack in the external electrode may occur when the device is put into continuous operation over a long period of time in a high electric field under a high pressure, eventually resulting in contact failure in the junction between the external electrode and the internal electrode. This may cause the failure in applying voltage to some of the piezoelectric layers and, after being used over a long period of time, lead to variation in the displacement characteristics or spark which causes the device to shut down.

In recent years, such problems as described above have become conspicuous since it is a common practice to operate the multi-layer piezoelectric element continuously with a higher electric field over a long period of time, as it is required to achieve a large amount of displacement from a compact multi-layer piezoelectric element.

Although the inactive layer disclosed in Patent Document 3 mitigates the difference in the degree of shrinkage between the active layer and the inactive layer, there remains a problem related to durability since cracks tend to occur in the interface between the electrode 61 that constitutes the inactive layer 62 and the piezoelectric layer (active layer) 63 when the device is put into continuous operation over a long period of time with a high voltage applied thereto.

The present invention has been made to solve the problems described above, and an object thereof is to provide a multi-layer piezoelectric element having high durability which allows it to increase the amount of displacement of a piezoelectric actuator under high voltage and high pressure, and does not undergo a change in the amount of displacement during continuous over a long period of time.

In order to achieve the object described above, the first multi-layer piezoelectric element according to the present invention comprises a stack having an active portion constituted from at least one piezoelectric layer and a plurality of internal electrodes consisting of first and second internal electrodes placed one on another, the active portion being subjected to expansion and contraction in response to a voltage applied across the first internal electrode and the second internal electrode, and external electrodes formed on two side faces of the stack with one thereof being connected to the first internal electrode and the other connected to the second internal electrode, wherein each of the external electrodes is constituted from three or more layers including a first layer formed in contact with the side face of the stack and a second layer formed on the first layer.

The first multi-layer piezoelectric element according to the present invention comprises a stack having an active portion constituted from at least one piezoelectric layer and a plurality of internal electrodes consisting of the first and the second internal electrodes placed one on another, and inactive layers made of a piezoelectric material located on both ends of the active portion, the active portion being subjected to expansion and contraction in response to a voltage applied across the first internal electrode and the second internal electrode, and external electrodes formed on two side faces of the stack with one thereof being connected to the first internal electrode and the other connected to the second internal electrode, wherein the inactive layers of the stack include dispersed metal.

A method for manufacturing a multi-layer piezoelectric element according to the present invention comprises the steps of forming piezoelectric layers on both end faces of the green stack made by stacking green sheets of piezoelectric material and electrically conductive layers alternately, forming a metal layer on the piezoelectric layer, and firing the green stack having the piezoelectric layer and the metal layer formed thereon and then removing the metal layer.

EFFECT OF THE INVENTION

With the first multi-layer piezoelectric element according to the present invention having the constitution described above, since each of the external electrodes is constituted from three or more layers including the first layer formed in contact with the side face of the stack and the second layer formed on the first layer, crack is contained within the interface between the three or more layers and stopped from propagating to the adjacent layers, thus the generation of crack that penetrates through the external electrode can be prevented.

Thus it is made possible to prevent the external electrode from being cracked due to dimensional change of the stack, so as to provide the multi-layer piezoelectric element of improved durability which does not experience variation in the amount of displacement even when put into continuous operation over a long period of time.

Also because the first multi-layer piezoelectric element according to the present invention has such a constitution as the inactive layer of the stack includes the metal dispersed therein, stress generated between the inactive layer and the active layer during shrinkage due to firing can be mitigated (equalized), and the amount of displacement of the piezoelectric actuator can be increased during operation under high voltage and high pressure. It is also made possible to maintain the amount of displacement constant during continuous operation over a long period of time, and improve durability during continuous operation under a high voltage over a long period of time.

The method for manufacturing a multi-layer piezoelectric element according to the present invention makes it possible to easily manufacture the multi-layer piezoelectric element where a metal is dispersed in the inactive layer, since the metal layer is removed after firing the green stack which has the metal layer formed on the piezoelectric material layer.

DESCRIPTION OF REFERENCE NUMERALS

| 1: | Piezoelectric layer |
|---|---|
| 2: | Internal electrode |
| 3: | Groove |
| 4, 15: | External electrode |
| 6: | Lead wire |
| 7: | Electrical conductivity assisting member |
| 8: | Electrode layer |
| 10: | Multi-layer piezoelectric element |
| 10a: | Green stack |
| 11: | Active portion |
| 12: | Inactive layer |
| 14: | Metal |
| 15a: | First layer of external electrode |
| 15b: | Intermediate layer |
| 15c: | Outermost layer of external electrode |
| 31: | Housing |
| 33: | Injection hole |
| 35: | Valve |
| 43: | Piezoelectric actuator |

BEST MODE FOR CARRYING OUT THE INVENTION

The multi-layer piezoelectric element according to embodiments of the present invention will now be described in detail.

First Embodiment

Figure 1A:
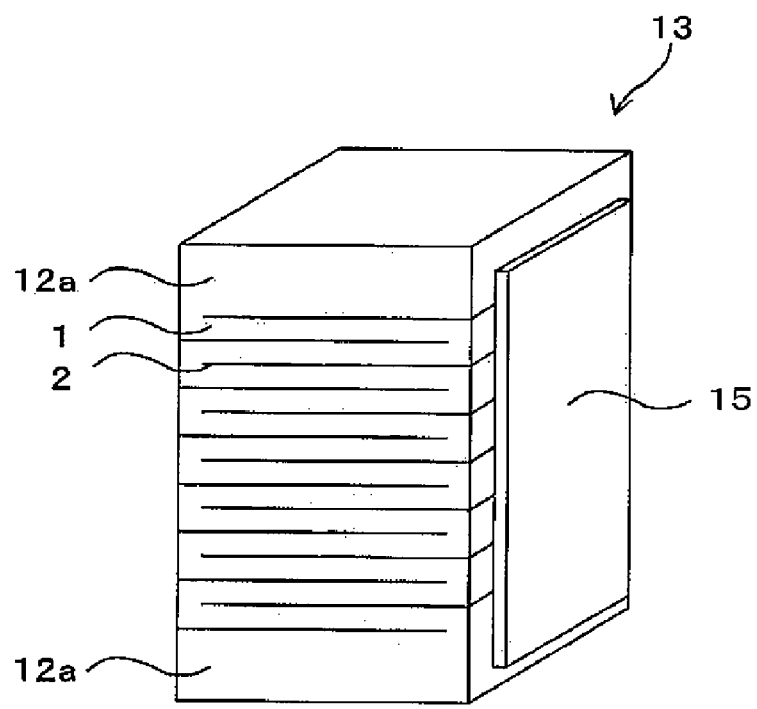
FIG. 1A is a perspective view showing the constitution of a multi-layer piezoelectric element according to first embodiment of the present invention.
Figure 1B:
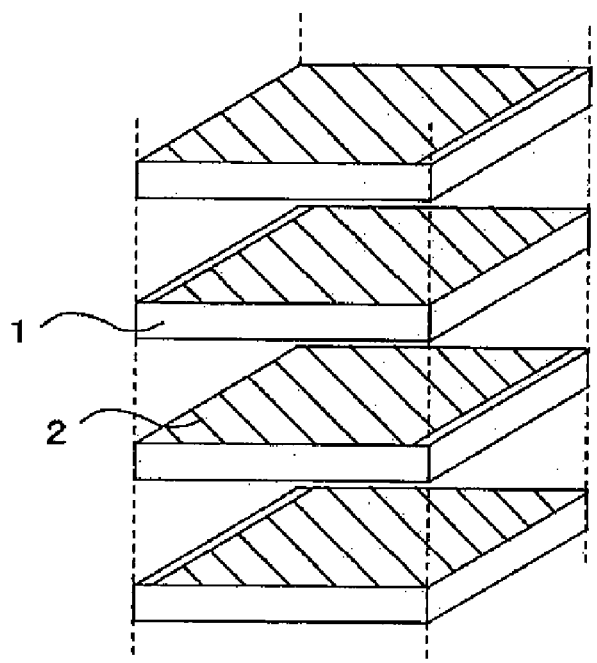
FIG. 1B is an exploded perspective view showing piezoelectric layers and internal electrodes being stacked in the multi-layer piezoelectric element of the first embodiment.
Figure 2:
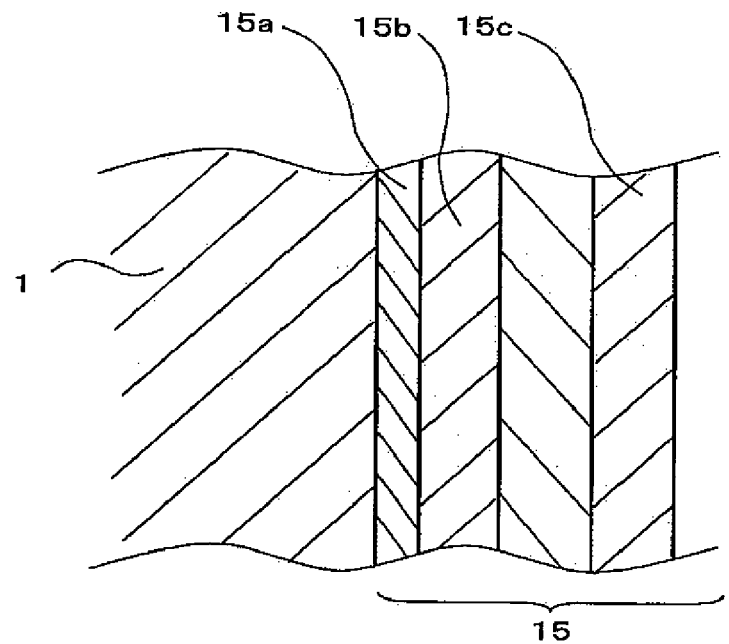
FIG. 2 is an enlarged sectional view showing multi-layer structure of an external electrode formed on a side face of the piezoelectric layer in the multi-layer piezoelectric element of the first embodiment.

FIG. 1A and FIG. 1B show the constitution of a multi-layer piezoelectric element according to the first embodiment of the present invention, FIG. 1A being a perspective view and FIG. 1B being an exploded perspective view showing piezoelectric layers and internal electrodes being stacked. FIG. 2 is an enlarged sectional view showing multi-layer structure of an external electrode formed on a side face of the piezoelectric layer in the multi-layer piezoelectric element of the present invention.

In the multi-layer piezoelectric element according to the first embodiment, as shown in FIG. 1A and FIG. 1B, the external electrodes 15 are formed on a pair of opposing side faces of a stack 13 constituted from the piezoelectric layers 1 and the internal electrodes 2 placed alternately one on another. An end of the internal electrode 2 is exposed on the side face of the stack 13 where the external electrode 15 is formed in every other layer, and the external electrode 15 is connected to the internal electrode 2 of which end is exposed.

Provided on both ends of the stack 13 in the direction of stacking are inactive layers 12a formed from the piezoelectric material 1. When the multi-layer piezoelectric element of the first embodiment is used as the multi-layer piezoelectric actuator, lead wires may be connected to the external electrodes 15 by soldering, with the lead wires being connected to a power source installed outside.

The internal electrode 2 disposed between the piezoelectric layers 1 is formed from a metallic material such as silver-palladium. In the multi-layer piezoelectric element, a predetermined voltage is applied to the piezoelectric layers 1 via the internal electrodes 2, so that the piezoelectric layers 1 undergo a displacement by the reverse piezoelectric effect.

The inactive layer 12a, in contrast, does not undergo a displacement even when a voltage is applied, since it is constituted from a plurality of layers of the piezoelectric material 1 where the internal electrodes 2 are not provided.

The multi-layer piezoelectric element of the first embodiment is characterized in that the external electrode 15 is constituted from three or more layers as shown in FIG. 2. The reason for constituting the external electrode 15 from three or more layers is to improve durability of the multi-layer piezoelectric element.

In case the multi-layer piezoelectric element having the external electrode 15 constituted from a single layer or two layers is operated, a crack starting in the surface of the external electrode 15 and a crack starting in the interface between the external electrode 15 and the piezoelectric layers 1 may merge into a damaging crack that causes wire breakage in the external electrode 15. The external electrode 15 constituted from two layers may also suffer peel-off of the two layers when the multi-layer piezoelectric element is operated continuously so that the piezoelectric layers 1 undergo repetitive dimensional changes. Such a trouble is likely to occur particularly in case the external electrode 15 is formed in 2-layer structure constituted from an external electrode layer, that includes glass added thereto so as to improve the bonding strength of the external electrode 15 and the piezoelectric layers 1 and is provided in contact with the piezoelectric layers 1, and an external electrode layer that includes less glass component and is provided on the outside of the former.

Therefore, the external electrode 15 of the multi-layer piezoelectric element that undergoes repetitive dimensional changes during continuous operation is required to maintain the junction with the piezoelectric layers 1 and be capable of expand and contract simultaneously as the multi-layer piezoelectric element undergoes dimensional changes. In order to meet this requirement, the external electrode 15 of the first embodiment is constituted in multi-layer structure as described below. That is, the external electrode 15 is constituted from three or more layers including a first layer 15a of the external electrode, an outermost layer 15c of the external electrode and an intermediate layer provided therebetween.

In the external electrode 15, the first layer 15a of the external electrode which contacts with the piezoelectric layer 1 has a high bonding strength with the piezoelectric layer. The outermost layer 15c which is located furthest from the piezoelectric layer has a low Young's modulus and a low resistivity. The intermediate layer provided therebetween mitigates the stress generated by the dimensional change during operation of the multi-layer piezoelectric element, and is a layer that has bonding strength with both the first layer 15a of the external electrode which contacts with piezoelectric layer 1 and the outermost layer 15c of the external electrode which is located furthest from the piezoelectric layer.

The three or more layers of the external electrode 15 are preferably continuously bonded together, in order to prevent such troubles as peel-off between the external electrode 15 and the piezoelectric layer 1 due to dimensional changes during continuous operation of the multi-layer piezoelectric element, peel-off within the external electrode 15 and wire breakage caused by crack in the external electrode 15 from occurring during operation. The external electrode 15 is more preferably constituted from five or less layers, in order to ensure smoothness of the external electrode 15 and suitability to mass production.

The electrically conductive material that constitutes the external electrode 15 is preferably a metal that has a low specific resistance and low hardness, such as gold, silver or copper, in consideration of the capability to sufficiently absorb the stress generated by the expansion and contraction of the actuator. More preferably copper or silver is used in order to make the multi-layer piezoelectric element having high durability. Furthermore preferably silver is used to make the multi-layer piezoelectric element having higher durability.

According to the present invention, the thickness of the first layer 15a of the external electrode, among the component layers of the external electrode 15, which makes contact with the piezoelectric layer 1 is preferably 10 µm or less. The thickness of the first layer 15a of the external electrode here means the mean value of thicknesses of the first layer of the external electrode measured by observing a cross section of the multi-layer piezoelectric element under an SEM or the like. When the thickness is more than 10 µm, the first layer of the external electrode which makes contact with the piezoelectric layer is subjected to tensile stress that may cause cracks when the multi-layer piezoelectric element is operated to expand. By setting the thickness to 10 µm or less, it is made possible to form the external electrode having durability so as not to suffer cracks when the device undergoes dimensional change. Durability can be improved by setting the thickness to 5 µm or less, or more preferably 3 µm or less. The thickness of the first layer 15a of the external electrode is most preferably set in a range from 0.5 µm to 2 µm, which further improves durability.

The thickness of the external electrode layers other than the first layer 15a is preferably larger than that of the first layer 15a, so that crack generated in the outermost layer of the external electrode 15 can be effectively suppressed from propagating to the other portion. In order to suppress crack from propagating to the other portion, the thickness of the layers other than the first layer 15a is preferably 5 µm or more, and more preferably 10 µm, or 15 µm or more. This improves durability of the external electrode 15 as a whole. Total thickness of the external electrode 15 in the direction of stacking is set to 15 µm or more which enables it to make the electrode capable of enduring continuous operation of the multi-layer piezoelectric element. When the total thickness is 20 µm, or more preferably 30 µm or more, it is made possible to prevent crack from occurring and causing wire breakage and decrease the resistance of the external electrode 15, so as to suppress heat from being generated in the external electrode 15.

When the total thickness is larger than 100 µm, the amount of displacement decreases significantly since the external electrode 15 becomes incapable of follow the displacement of the piezoelectric layers 1. Accordingly, the total thickness is preferably in a range from 30 to 100 µm.

Also according to the present invention, it is preferable that the first layer 15a of the external electrode includes metal oxide in a concentration higher than that in the second layer 15b of the external electrode that is formed to cover the first layer 15a of the external electrode. This is because, when content of the metal oxide of the first layer 15a which makes contact with the piezoelectric layer 1 is lower than in the second layer 15b, specific resistance of the first layer 15a becomes lower than that of the second layer 15b, and current flows into the first layer 15a that has the lower specific resistance when the multi-layer piezoelectric element is operated, thus resulting in overheat of the first layer 15a and peel-off between the piezoelectric layer 1 and the first layer 15a and/or thermal excursion of the multi-layer piezoelectric element due to rising temperature.

The metal oxide may be the oxide of one of metals belonging to the groups 1 to 15 of the Periodic Table, and particularly oxide of Si, B, Bi, Pb, Zn, Al, Ca, Ba, Ti, Zr or rare earth metal that can form glass at a temperature not higher than 1000° C. is preferably used. Particularly, oxide of Si, B, Bi, Pb or Zn is capable of forming an amorphous substance at a further lower temperature and is more preferably used. When such an oxide is used, the first layer 15a bonds with the piezoelectric layer 1 firmly under the conditions of heat treatment to form the external electrode in the multi-layer piezoelectric element. In order to make the multi-layer piezoelectric element having high durability, content of the metal oxide in the first layer of the external electrode is preferably 30% by volume or more, more preferably 50% by volume or more and most preferably 70% by volume or more.

Further according to the present invention, content of the metal oxide in the outermost layer 15c of the external electrode 15 is preferably less than that in any other layers of the external electrode. Since this results in lower Young's modulus of the outermost layer 15c, it is made easier to suppress the occurrence of cracks in the external electrode when the external electrode expands and contracts according to the dimensional change of the device as the multi-layer piezoelectric element is operated continuously. Further, since specific resistance of the external electrode can be made lower, the device does not overheat even when subjected to continuous operation and thermal excursion does not occur. It goes without saying that the constitution having a higher concentration of the metal component also makes soldering and welding easier and decreases the contact resistance even when the joint is formed from an electrically conductive resin.

When the content of the metal oxide in any of the layers of the external electrode 15 other than the first layer 15a is less than that in the first layer 15a, heating of the device can be suppressed. However, in order to increase the bonding strength of the external electrode and prevent peel-off from occurring in the layer, it is preferable that the content of the metal oxide decreases gradually from the first layer 15a toward the electrode layer located outside. When the content of the metal oxide in the component layers of the external electrode 15 is controlled to decrease gradually in such a manner as the first layer>the second layer>the third layer> . . . >the outermost layer, adjacent layers of the external electrode can be caused to have thermal expansion coefficients of proximate values, so as to increase the bonding strength between the layers.

The composition of the external electrode 15 can be determined by analyzing by the method of EPMA (electron probe micro analysis) or other method. In order to make the multi-layer piezoelectric element having high durability, content of the metal oxide in the outermost layer 15c of the external electrode 15 is preferably 30% by volume or less, more preferably 10% by volume or less and most preferably 5% by volume or less.

Also according to the present invention, the metal oxide preferably consists mainly of glass. This makes it possible to suppress the formation of an intermetallic compound in the external electrode 15 which would make the electrode brittle. As a result, the glass component is dispersed in the grain boundaries of the metal component that constitutes the external electrode 15, thus causing the external electrode 15 to be firmly bonded with the piezoelectric layer 1.

A method for manufacturing a multi-layer piezoelectric element of the present invention will now be described.

First, a calcined powder of a piezoelectric ceramic material constituted from perovskite type oxide consisting of $PbZrO_3$—$PbTiO_3$ or the like, a binder made of an organic polymer such as acrylic resin or butyral resin and a plasticizer such as DBP (dibutyl phthalate) or DOP (dioctyl phthalate) are mixed to form a slurry. The slurry is formed into ceramic green sheets, that would become the piezoelectric layers 1, by a known method such as doctor blade process or calender roll process or other tape molding method.

Then a metal powder such as silver-palladium that constitutes the internal electrode 2, a metal oxide such as silver oxide, a binder and a plasticizer are mixed to prepare an electrically conductive paste which is applied onto the top surface of the ceramic green sheet by screen printing method or the like to the thickness of 1 to 40 μm.

A plurality of the green sheets having the electrically conductive paste printed on the top surface thereof are stacked one on another, and the stack is heated at a predetermined temperature to remove the binder. The stack is then fired at a temperature in a range from 900 to 1200° C. thereby to make the stack 13.

When the metal powder such as silver-palladium that constitutes the internal electrode is added to the green sheet that forms the portion of the inactive layer 12a as will be described in detail in second embodiment, shrinking behavior and shrinking rate can be matched between the inactive layer 12a and the other portions during sintering, and it is made possible to form a dense stack.

The method of making the stack 13 is not limited to that described above, and any manufacturing method may be employed as long as the stack 13 can be made in such a constitution as a plurality of the piezoelectric layers 1 and a plurality of the internal electrodes 2 are stacked alternately one on another.

The internal electrodes 2 of which ends are exposed on the side face of the multi-layer piezoelectric element and the internal electrodes 2 of which ends are not exposed are stacked alternately.

An electrically conductive silver-glass paste is prepared by adding a binder to a glass powder, and the paste is formed into a sheet that is dried to remove solvent while controlling the density of the green sheet in a range from 6 to 9 g/cm$^3$. The sheet is transferred onto the external electrode forming surface of the column-like stack 13. The stack 13 is baked at a temperature that is higher than the softening point of the glass and is not higher than the melting point (965° C.) of silver and is not higher than 4/5 of the firing temperature (° C.) of the stack 13. In this process, the binder included in the sheet that is formed from the electrically conductive silver-glass paste is evaporated and removed, so that the external electrode 15 is formed from a porous electrical conductor having 3-dimensional mesh structure.

While the plurality of sheets having the paste to form the external electrodes applied thereon may be fired after being stacked or the layers may be stacked and fired one by one, it is more advantageous to fire the plurality of sheets after being stacked for the reason of mass production. In case the glass component is varied from one external electrode layer to another, sheets having different contents of the glass component may be used. When it is desired to form a thin glass-rich layer in contact with the piezoelectric layer, a glass-rich paste may be printed by screen printing process or the like on the stack, so as to stack the multi-layer sheet. In this process, a sheet having the thickness of 5 μm or less may be used instead of printing.

The temperature at which the electrically conductive silver-glass paste is bonded by baking is preferably in a range from 500 to 800° C. for the purpose of joining the silver content that is included in the electrically conductive silver-glass paste and the internal electrode 2 through diffusion bonding so as to effectively form a neck portion, thus effectively causing the voids existing in the external electrode 15 to remain and partially joining the external electrode 15 and the side face of the column-like stack 13. Softening point of the glass component included in the electrically conductive silver-glass paste is preferably in a range from 500 to 800° C.

When the baking temperature is higher than 800° C., sintering of the silver powder of the electrically conductive silver-glass paste would proceed excessively, such that the porous electrical conductor of 3-dimensional mesh structure cannot be effectively formed and the external electrodes 15 become too dense. As a result, the value of Young's modulus of the external electrode 15 becomes too high to effectively absorb the stress generated during operation, eventually leading to breakage of the external electrode 15. Baking is preferably carried out at a temperature that is not higher than 1.2 times the softening point of the glass.

When the baking temperature is lower than 500° C., on the other hand, the end of the internal electrode 2 and the external electrode 15 cannot be joined sufficiently through diffusion bonding, and therefore the neck portion cannot be formed thus giving rise to the possibility of spark occurring between the internal electrode 2 and the external electrode 15 during operation.

Then the stack 13 having the external electrodes 15 formed thereon is immersed in a silicone rubber solution while deaerating the silicone rubber solution by evacuation, so as to fill the groove of the stack 13 with the silicone rubber. Then the stack 13 is pulled out of the silicone rubber solution, with the stack 13 coated with the silicone rubber on the side faces thereof. Then the silicon rubber that fills the groove and covers the side faces of the column-like stack 13 is hardened, thereby to complete the multi-layer piezoelectric element of the present invention.

Then lead wires are connected to the external electrodes 15, and DC voltage of 0.1 to 3 kV/mm is applied between the pair of external electrodes 15 via the lead wires so as to apply polarization treatment to the stack 13, thereby to complete the multi-layer piezoelectric actuator that utilizes the multi-layer piezoelectric element of the present invention. When the lead wires of the multi-layer piezoelectric actuator are connected to an external voltage source and the voltage is supplied via the lead wires and the external electrodes 15 to the internal electrodes 2, the piezoelectric layers 1 undergo a significant amount of displacement by the reverse piezoelectric effect. The multi-layer piezoelectric actuator can be used, for example, as an automobile fuel injection valve that supplies fuel to an engine.

Second Embodiment

A multi-layer piezoelectric element according to second embodiment of the present invention will now be described.

The multi-layer piezoelectric element of the second embodiment is similar to the multi-layer piezoelectric element of the first embodiment in the constitution of the active portion 11 of the stack 10, but is distinguished in the constitution of the inactive layer 12.

Figure 3A:
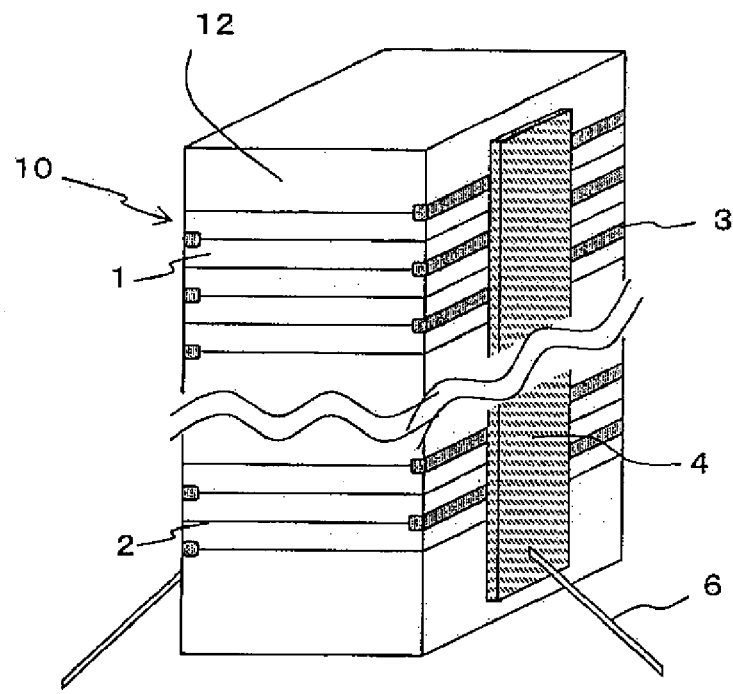
FIG. 3A is a perspective view showing the constitution of a multi-layer piezoelectric element according to second embodiment of the present invention.
Figure 3B:
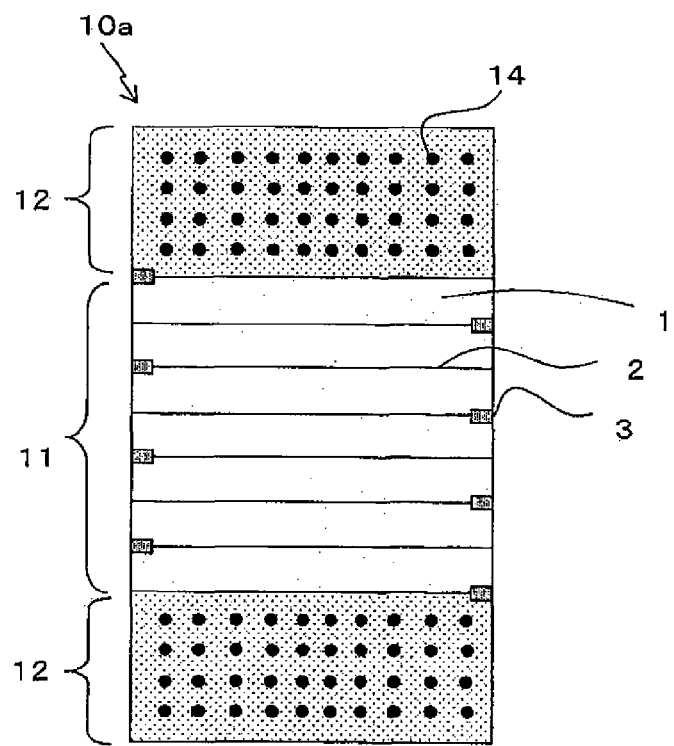
FIG. 3B is a sectional view of the multi-layer piezoelectric element according to the second embodiment.

FIG. 3A and FIG. 3B show the constitution of the multi-layer piezoelectric element according to the second embodiment of the present invention, FIG. 3A being a perspective view and FIG. 3B being a sectional view showing an active portion consisting of internal electrode layers and piezoelectric layers stacked one on another and protective layer.

As shown in FIG. 3A and FIG. 3B, the multi-layer piezoelectric element according to the second embodiment has such a constitution as groove is formed to provide insulation between the external electrode 4 and the internal electrode 2 in every other layer on the side face of the active portion 11 formed by placing the piezoelectric layers 1 and the internal electrodes 2 alternately one on another, and the external electrodes 4 are formed so as to establish electrical continuity between the internal electrode 2 and the external electrode 4 in every other layer.

The following description will be focused on the inactive layer 12 having the characteristic constitution of the second embodiment.

In the multi-layer piezoelectric element of the second embodiment, the inactive layer 12 is formed from the piezoelectric material similar to that of the piezoelectric layer 1, but is characterized by a metal 14 dispersed therein.

The present invention related to the multi-layer piezoelectric element of the second embodiment has been completed on the basis of such findings obtained by the inventor of the present application that, by dispersing the metal 14 in the inactive layer 12 as shown in FIG. 3B, it is made possible to (1) mitigate the difference in shrinkage between the inactive layer 12 and the active portion 11 when the stack 10 is fired so as to obtained the multi-layer piezoelectric element with very small residual stress, and (2) obtain the stack 10 of higher density as the metal 14 which is dispersed accelerates sintering when firing the stack 10a, that is capable of enduring the stress generated by vibration during continuous operation of the multi-layer piezoelectric element.

Accordingly, the multi-layer piezoelectric element of the second embodiment comprising the inactive layer 12 that includes the metal 14 dispersed therein has high durability and high reliability and is free from deterioration after long period of use.

Dispersion of metal herein does not mean the inclusion of the metal in the form of layers such as the active layer comprising the piezoelectric material and the internal electrode, but means the metal element diffused in the piezoelectric material of the inactive layer 12, in a typical case. The metal element may also be diffused from the surface of the inactive layer 12 to the inside of the inactive layer 12. Dispersion of the metal 14 can be determined by EPMA (Electron Probe Micro Analysis) or other method. Specifically, distribution of the metal can be determined by analyzing a section of the inactive layer by EPMA.

Melting point of the metal 14 dispersed in the inactive layer 12 is preferably not higher than 1.6 times the firing temperature of the multi-layer piezoelectric element. This is because the metal 14 cannot be diffused efficiently in the inactive layer 12 when the metal 14 has a melting point higher than that described above. When the melting point of the metal 14 is not higher than 1.6 times the firing temperature of the multi-layer piezoelectric element, the metal element can be easily diffused from the surface of the inactive layer 12 to the inside of the inactive layer 12.

In case two or more kinds of metal 14 are included or in case alloy consisting of two or more kinds of metal are included, it is preferable that the melting point of each component metal is not higher than 1.6 times the firing temperature of the multi-layer piezoelectric element. The above discussion does not apply to a metal which does not contribute to the dispersion in the inactive layer 12.

Also according to the present invention, the metal 14 dispersed in the inactive layer 12 is preferably at least one of Ag, Pd, Cu, Ca, Na, Pb and Ni. This is because these metals have melting points which are near to or lower than the firing temperature of the stack 10a and actively diffuse into the inactive layer 12 when the stack 10a is fired, thereby achieving uniform distribution of the metal 14 in the inactive layer 12.

The amount of the metal 14 dispersed in the inactive layer 12 is preferably in a range from 0.001 to 1.0% by weight in proportion to the inactive layer 12. When the concentration is less than 0.001% by weight, the difference in shrinkage between the inactive layer 12 and the active portion 11 during firing leads to a significant strain generated therebetween and, in the worst case, may result in delamination after firing or after a long period of use.

When concentration of the metal 14 dispersed is higher than 1.0% by weight, insulation property of the inactive layer 12 lowers thus impairing the function thereof as the inactive layer. In order to further decrease the residual stress in the inactive layer 12 after firing and eliminate defects of the multi-layer piezoelectric element after firing, it is more preferable that the amount of the metal 14 in the inactive layer 12 is in a range from 0.05 to 1.0% by weight. In order to achieve high reliability against the stress generated by vibration during continuous operation of the multi-layer piezoelectric element, it is more preferable that the amount of the metal 12 is in a range from 0.1 to 1.0% by weight. The content of the metal 14 in the inactive layer 12 can be determined by ICP (Inductively Coupled Plasma Atomic) emission analysis.

The thickness of the inactive layer 12 is preferably in a range from 0.1 mm to 2.0 mm. When the thickness is less than 0.1 mm, the inactive layer 12 may be destroyed by the stress generated by vibration during continuous operation of the multi-layer piezoelectric element. When the thickness is larger than 2.0 mm, it becomes difficult to disperse the metal 14 in the inactive layer 12. Improper dispersion of the metal 14 in the inactive layer 12 results in difference in shrinkage after firing between a portion where much of the metal is dispersed and a portion where less metal is dispersed, thus causing a significant strain during shrinkage due to firing, delamination after firing or higher tendency of delamination after long period of use. While the inactive layers 12 are provided on both ends of the stack 10 in the stacking direction, the thickness of the inactive layer 12 refers to the thickness of one of the inactive layers 12.

It is preferable that the metal 14 dispersed in the inactive layer 12 has the same composition as that of the internal electrode 2. This is because use of a metal other than the internal electrode 2 may lead to the generation of strain during shrinkage due to firing, since the inactive layer 12 and the active portion 11 that includes the internal electrode 2 shrink in different manners when the stack 10a is fired.

Components other than the inactive layer in the second embodiment will now be described.

In the multi-layer piezoelectric element of the second embodiment, the internal electrode 2 of which end is exposed on the side face of the stack and the internal electrode 2 of which end is not exposed are stacked alternately, and the groove 3 is formed in the piezoelectric layer 1 disposed between the internal electrode 2 of which end is not exposed and the external electrode 4. According to the present invention, the groove is preferably filled with an insulating material which has Young's modulus lower than that of the piezoelectric layer 1. This constitution makes it possible to mitigates the stress generated by the displacement during operation of the multi-layer piezoelectric element, and suppress heat generation from the internal electrode 2 during continuous operation.

According to the present invention, the temperature of firing the stack is preferably in a range from 900 to 1200° C. When the firing temperature is lower than 900° C., it becomes difficult to form the piezoelectric layer 1 of high density because it is not fired sufficiently due to the low temperature. When the firing temperature is higher than 1200° C., the stress caused by the difference in shrinkage between the internal electrode 2 and the piezoelectric layer 1 during firing increases, and crack may occur during continuous operation of the multi-layer piezoelectric element.

An effect similar to that of the first embodiment can be achieved with the multi-layer piezoelectric element of the second embodiment, when the external electrode comprising three or more layers described in the first embodiment is sued.

The external electrodes 4 are preferably formed from a porous electrical conductor having 3-dimensional mesh structure. Unless the external electrodes 4 are formed from a porous electrical conductor having 3-dimensional mesh structure, the external electrodes 4 do not have flexibility and cannot follow the expansion and contraction of the multi-layer piezoelectric actuator, eventually causing breakage of the external electrodes 4 and/or contact failure between the external electrode 4 and the internal electrode 2.

The 3-dimensional mesh structure means, rather than such a state as spherical voids are included in the external electrodes 4, that the powders of electrically conductive material and glass that constitute the external electrodes 4 are baked at a relatively low temperature and therefore sintering reaction does not fully proceed so that the voids are connected to each other to a certain extent, thereby forming 3-dimensional configuration of the powders of the electrically conductive material and the glass that constitute the external electrodes 4 being bonded with each other.

Void ratio in the external electrode 4 is preferably in a range from 30 to 70% by volume. The void ratio means the proportion of the volume occupied by the voids in the external electrodes 4. When the void ratio in the external electrode 4 is less than 30% by volume, the external electrodes 4 may not be capable of enduring the stress generated by the expansion and contraction of the multi-layer piezoelectric actuator, eventually leading to breakage of the external electrode 4. When the void ratio in the external electrode 4 is higher than 70% by volume, resistance of the external electrode 4 becomes higher and the external electrode 4 may be broken due to localized heating when a large current is supplied.

It is also preferable that a glass-rich layer is formed on the surface of the external electrode 4 on the piezoelectric layer 1 side. This is because absence of the glass-rich layer makes it difficult to join with the glass component included in the external electrode 4, thus leading to difficulty in achieving firm bonding between the external electrode 4 and the piezoelectric layer 1.

It is further preferable that the softening point (° C.) of the glass that constitutes the external electrode 4 is not higher than 4/5 times the melting point (° C.) of the electrically conductive material that constitutes the internal electrode 2. This is because, when the softening point of the glass that constitutes the external electrode 4 is higher than 4/5 times the melting point of the electrically conductive material that constitutes the internal electrode 2, the softening point of the glass that constitutes the external electrode 4 and the melting point of the electrically conductive material that constitutes the internal electrode 2 become proximate to each other and, as a result, the temperature of bonding the external electrode 4 by baking becomes proximate to the melting point of the electrically conductive material that constitutes the internal electrode 2. Such a condition results in coagulation of the electrically conductive material of the internal electrodes 2 and the external electrodes 4 that impedes the joining through diffusion from taking place. Also it makes it impossible to set the baking temperature at a proper temperature for the glass component of the external electrode 4 to soften, resulting in failure to achieve sufficient strength of bonding by the softened glass.

The glass that constitutes the external electrodes 4 is preferably amorphous. This is because the external electrode 4 constituted from crystalline glass is not capable of absorbing the stress generated by the expansion and contraction of the multi-layer piezoelectric actuator, and may be cracked.

It is also preferable that the thickness of the external electrode 4 is smaller than the thickness of the piezoelectric layer 1. This is because the external electrodes 4 thicker than the piezoelectric layer 1 has higher strength, resulting in increasing load on the junction between the external electrodes 4 and the internal electrode 2, eventually causing contact failure when the stack 10 undergoes expansion and shrinkage.

A method for manufacturing a multi-layer piezoelectric element of the present invention will now be described.

According to this manufacturing method, first the green ceramic sheets which become the piezoelectric layers 1 are made similarly to the first embodiment.

The green sheets are cut to proper size and secured onto a frame.

Then a metal powder such as silver-palladium that constitutes the internal electrode 2, a binder and a plasticizer are mixed to prepare an electrically conductive paste which is applied onto the top surface of the ceramic green sheet by screen printing method or the like to the thickness of 1 to 40 µm, to make the green ceramic sheets which become the active portion 11.

Then green sheets without electrically conductive paste printed thereon are prepared for the inactive layer 12.

The green sheets for the active portion 11 and the green sheets for the inactive layer 12 are stacked in plurality so that portions where the green sheets for the inactive layer 12 are put on the top and bottom of the a portion where the green ceramic sheets for the active portion 11 having the electrically conductive paste printed are placed on the top surface, and are pressured to bond. The portions which become the inactive layer 12 are stacked in plurality to form layers having thickness from 0.1 to 2.0 mm on top and bottom of the active portion 11.

Figure 5:
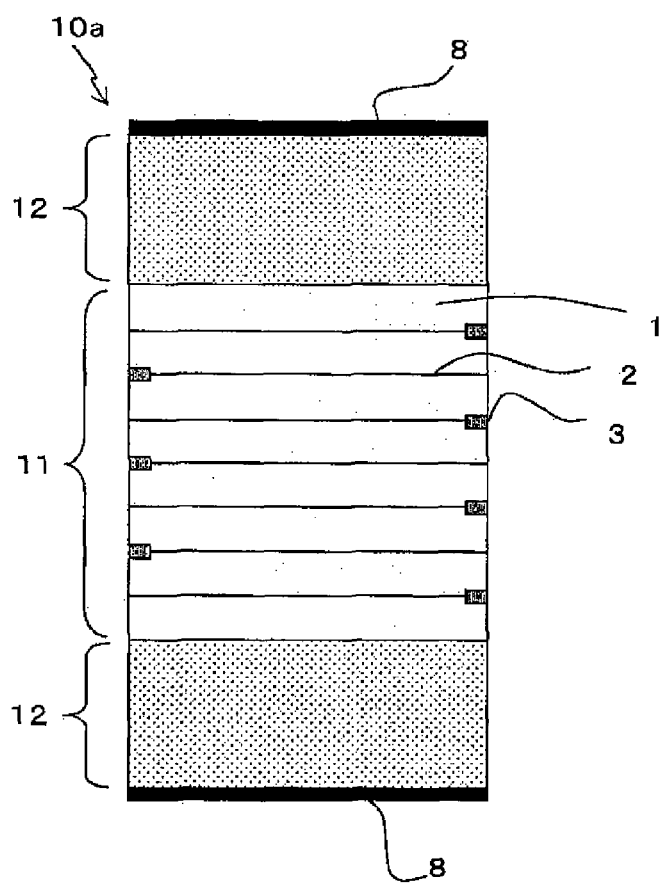
FIG. 5 is a sectional view of the stack prior to firing in the process of manufacturing the multi-layer piezoelectric element according to the second embodiment.

Then the stacked green sheets are cut to proper size. The electrically conductive paste including metal component (for example, Ag, Pd, Cu, Ca, Na, Ni or Pb) to be dispersed in the inactive layer is printed on both end faces of green stack 10a having the inactive layers 12 formed thereon as shown in FIG. 5, thereby forming a metal layer 8. Then after removing the binder by heating to a predetermined temperature, the stack is fired at a temperature from 900 to 1200° C., and the metal layer 8 is removed by means of a surface grinding machine or the like after firing, thereby making the stack 10.

The thickness of the metal layer 8 is preferably 5 mm or less. When the thickness of the metal layer 8 is larger than 5 mm, the metal layer 8 may be cracked due to the difference in shrinkage between the metal layer 8 and the inactive layer 12 when the stack 10a is fired.

The internal electrode 2 of which end is exposed on the side face of the stack 10a and the internal electrode 2 of which end is not exposed are stacked alternately, and the groove 3 is formed in the piezoelectric layer 1 disposed between the internal electrode 2 of which end is not exposed and the external electrode 4. The groove 3 is filled with an insulating material such as resin or rubber which has Young's modulus lower than that of the piezoelectric layer 1. The groove 3 is formed on the side face of the active portion 11 by a dicing apparatus or the like. The electrically conductive material that constitutes the external electrode 4 is preferably silver that has low Young's modulus or an alloy based on silver in order to absorb the stress generated by the expansion and contraction of the multi-layer piezoelectric element.

Then an electrically conductive silver-glass paste is prepared by adding a binder to a glass powder, and the paste is formed into a sheet that is dried to remove solvent while controlling the density of the green sheet in a range from 6 to 9 g/cm$^3$. The sheet is transferred onto the external electrode forming surface of the active portion 11. The stack is baked at a temperature that is higher than the softening point of the glass and is not higher than the melting point (965° C.) of silver and is not higher than 4/5 of the firing temperature (° C.). In this process, the binder component included in the sheet that is formed from the electrically conductive silver-glass paste is evaporated and removed, so that the external electrode 4 is formed from a porous electrical conductor having 3-dimensional mesh structure.

The temperature at which the electrically conductive silver-glass paste is bonded by baking is preferably in a range from 500 to 700° C. for the purpose of joining the silver content that is included in the electrically conductive silver-glass paste and the internal electrode 2 through diffusion bonding so as to effectively form a neck portion between the particles, thus effectively causing the voids existing in the external electrode 4 to remain and partially joining the external electrode 4 and the side face of the stack. Softening point of the glass component included in the electrically conductive silver-glass paste is preferably in a range from 500 to 700° C.

When the baking temperature is higher than 700° C., sintering of the silver powder of the electrically conductive silver-glass paste would proceed excessively, such that the porous electrical conductor of 3-dimensional mesh structure cannot be effectively formed and the external electrodes 4 become too dense. As a result, the value of Young's modulus of the external electrode 4 becomes too high to effectively absorb the stress generated during operation, eventually leading to breakage of the external electrode 4. Baking is preferably carried out at a temperature that is not higher than 1.2 times the softening point of the glass.

When the baking temperature is lower than 500° C., on the other hand, the end of the internal electrode 2 and the external electrode 4 cannot be joined sufficiently through diffusion bonding, and therefore the neck portion between the particles cannot be formed thus giving rise to the possibility of spark occurring between the internal electrode 2 and the external electrode 4 during operation.

The thickness of the sheet of the electrically conductive silver-glass paste is preferably smaller than that of the piezoelectric layer 1, and more preferably 50 μm or less so as to be capable of following the expansion and contraction of the actuator.

Then the active portion 11 having the external electrodes 4 formed thereon is immersed in a silicone rubber solution while deaerating the silicone rubber solution by evacuation, so as to fill the groove 3 of the active portion 11 with the silicone rubber. Then the active portion 11 is pulled out of the silicone rubber solution, with the active portion 11 being coated with the silicone rubber on the side faces thereof. Then the silicon rubber that fills the groove 3 and covers the side faces of the active portion 11 is caused to harden, thereby to complete the multi-layer piezoelectric element of the present invention.

Then the lead wires 6 are connected to the external electrodes 4, and DC voltage of 0.1 to 3 kV/mm is applied between the pair of external electrodes 4 via the lead wires 6 so as to apply polarization treatment to the active portion 11, thereby to complete the multi-layer piezoelectric actuator that utilizes the multi-layer piezoelectric element of the present invention. When the lead wires 6 of the multi-layer piezoelectric actuator are connected to an external voltage source and the voltage is supplied via the lead wires and the external electrodes 4 to the internal electrodes 2, the piezoelectric layers 1 undergo a significant amount of displacement by the reverse piezoelectric effect. The multi-layer piezoelectric actuator can be used, for example, as an automobile fuel injection valve that supplies fuel to an engine.

Preferred forms of the internal electrode and the other components in the first and second embodiments will now be described.

(Internal Electrode)

According to the present invention, it is preferable that the metal compound in the internal electrode 2 includes group 8 to group 10 metal and/or group 11 metal as the main components. This is because these metal compounds have high heat resistance and therefore allow the piezoelectric layer 1 which has a higher firing temperature and the internal electrode 2 to be fired at the same time. When the piezoelectric layer and the internal electrode are fired at the same time, the external electrode can be fired at a temperature lower than the sintering temperature of the piezoelectric layer, thus avoiding violent mutual diffusion of the piezoelectric layer and the external electrode.

It is preferable that such a metal compound is included in the internal electrode 2 as the main component that proportion M1 (% by weight) of the group 8 to group 10 metal and proportion M2 (% by weight) of the group 11 metal satisfy the relations $0<M1\leq15$, $85\leq M2<100$ and $M1+M2=100$. This is because proportion of the group 8 to group 10 metal higher than 15% by weight results in high specific resistance of the internal electrode 2 which causes the internal electrodes 2 to generate heat when the multi-layer piezoelectric element is operated continuously, thus affecting the piezoelectric layer 1 which has temperature dependency to lower the displacement characteristic thereof and giving rise to the possibility of decreasing the amount of displacement of the multi-layer piezoelectric element. Moreover, when the external electrode 15 is formed, while the external electrode 15 and the internal electrode 2 are joined together through mutual diffusion, proportion of the group 8 to group 10 metal higher than 15% by weight leads to higher hardness of the portion of the external electrode 15 where the component of the internal electrode is diffused, thus resulting in lower durability for the multi-layer piezoelectric element that undergoes dimensional change during operation. In order to suppress the group 11 metal included in the internal electrode 2 from migrating into the piezoelectric layers 1, it is preferable to control the proportion of the group 8 to group 10 metal in a range from 0.001 to 15% by weight. For the purpose of improving the durability of the multi-layer piezoelectric element, proportion of the group 8 to group 10 metal is preferably in a range from 0.1 to 10% by weight. In case excellent heat conductivity and higher durability are required, proportion of the group 8 to group 10 metal is preferably in a range from 0.5 to 9.5% by weight. In order to improve the durability further, proportion of the group 8 to group 10 metal is preferably in a range from 2 to 8% by weight.

The proportion of the group 11 metal is preferably 85% by weight or more because proportion of the group 11 metal lower than 85% by weight results in high specific resistance of the internal electrode 2 which causes the internal electrodes 2 to generate heat when the multi-layer piezoelectric element is operated continuously. In order to suppress the group 11 metal included in the internal metal 12 from migrating into the piezoelectric layers 1, it is preferable to control the proportion of the group 11 metal in a range from 85 to 99.999% by weight. For the purpose of improving the durability of the multi-layer piezoelectric element, proportion of the group 11 metal is preferably in a range from 90 to 99.9% by weight. In case higher durability is required, the proportion of the group 11 metal is preferably in a range from 90.5 to 99.5% by weight. In order to improve the durability further, the proportion of the group 11 metal is preferably in a range from 92 to 98% by weight.

Concentrations of the group 8 to group 10 metals and the group 11 metal in the internal electrode 2 can be determined by analytical method such as EPMA (Electron Probe Micro Analysis).

Metal element included in the internal electrode 2 of the present invention is preferably the group 8 to group 10 metal that is at least one kind selected from among Ni, Pt, Pd, Rh, Ir, Ru and Os, and the group 11 metal that is at least one kind selected from among Cu, Ag and Au, since such a metal composition is advantageous in volume production when the alloy powder synthesizing technology available today is employed.

Further, it is preferable that the group 8 to group 10 metal included in the internal electrode 2 is at least one kind selected from among Pt and Pd, and the group 11 metal is at least one kind selected from among Ag and Au. This composition makes it possible to form the internal electrode 2 which has high heat resistance and low specific resistance.

It is also preferable that the group 8 to group 10 metal included in the internal electrode 2 is Ni, because it makes it possible to form the internal electrode 2 which has high heat resistance.

Further, it is preferable that the group 11 metal of the metal component of the internal electrode 2 is Cu. This composition makes it possible to form the internal electrode 2 which has high heat conductivity with low hardness.

Further it is preferable to add oxide, nitride or carbide along with the metal compound in the internal electrode 2. This increases the strength of the internal electrode, thereby improving the durability of the multi-layer piezoelectric element. It is particularly preferable to add oxide since it increases the bonding strength between the internal electrode and the piezoelectric layer. The proportion of the inorganic compound is preferably 50% by volume or less. This makes it possible to make the bonding strength between the internal electrode 2 and the piezoelectric layer less than the strength of the piezoelectric layer 1. The proportion of the inorganic compound is more preferably 30% by volume or less, since it enables it to improve the durability of the multi-layer piezoelectric element.

It is preferable that the oxide described above includes perovskite type oxide consisting of $PbZrO_3$—$PbTiO_3$ as the main component. Contents of oxide and other compounds that have been added can be determined from the area ratio of the corresponding grains in the internal electrode measured on an SEM photograph of a section of the multi-layer piezoelectric element.

(Piezoelectric Layer)

According to the present invention, it is preferable that the piezoelectric layer 1 includes perovskite type oxide as the main component. This is because the piezoelectric layer 1 formed from perovskite type piezoelectric ceramic material such as barium titanate ($BaTiO_3$) has high piezoelectric strain constant $d_{33}$ which enables it to increase the amount of displacement. This constitution also enables the piezoelectric layer 1 and the internal electrode 2 to be fired at the same time. It is also preferable that the piezoelectric layer 1 includes perovskite type oxide consisting of $PbZrO_3$—$PbTiO_3$, that has a relatively high value of piezoelectric strain constant $d_{33}$, as the main component.

The firing temperature of the piezoelectric material is preferably in a range from 900 to 1000° C. When the firing temperature is lower than 900° C., the firing process does not fully proceed, and it becomes difficult to make dense piezoelectric material 1. When the firing temperature is higher than 1000° C., bonding strength between the internal electrode 2 and the piezoelectric layer 1 becomes larger.

In case the multi-layer piezoelectric element of the present invention has such a constitution as the internal electrode 2 of which end is exposed on the side face thereof and the internal electrode 2 of which end is not exposed are stacked alternately, and the groove is formed in the side face between the internal electrode 2 of which end is not exposed and the external electrode 15, the groove is preferably filled with an insulating material which has Young's modulus lower than that of the piezoelectric layer 1. This constitution makes it possible to mitigate the stress generated by the displacement during operation of the multi-layer piezoelectric element, and suppress heat generation from the internal electrode 2 during continuous operation.

(Electrical Conductivity Assisting Member 7 Provided on the External Electrode 4)

Figure 4A:
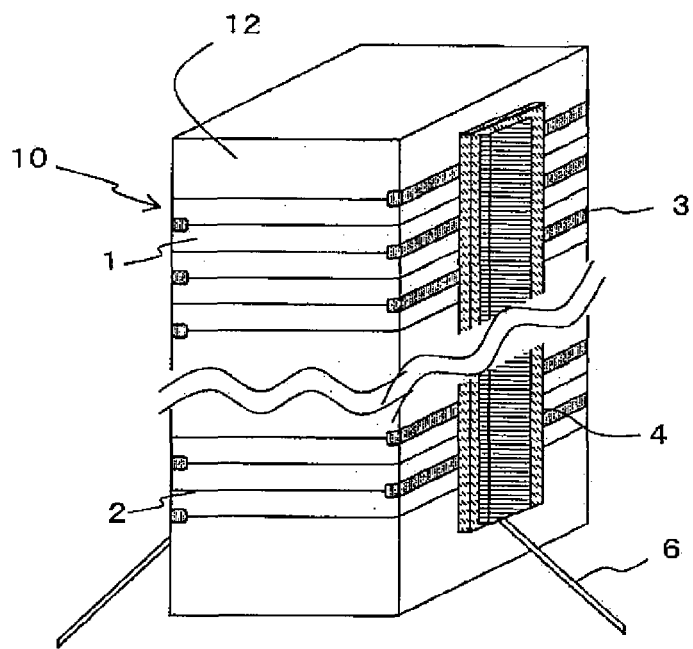
FIG. 4A is a perspective view showing the multi-layer piezoelectric element according to the second embodiment having an electrical conductivity assisting member formed thereon.
Figure 4B:
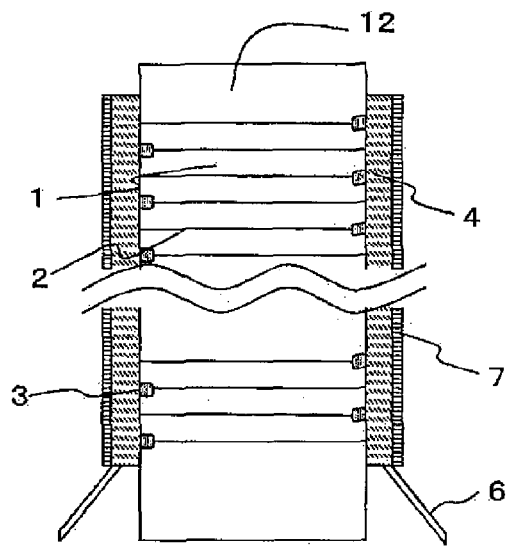
FIG. 4B is a sectional view of FIG. 4A.

It is also preferable that an electrical conductivity assisting member 7 formed from an electrically conductive adhesive, including a metal mesh or a mesh-like metal sheet embedded therein, is provided on the external surface of the external electrode 4, as shown in FIG. 4B. Unless the electrical conductivity assisting member 7 is provided on the external surface of the external electrode 4, the external electrodes 4 is not capable of tolerating a large current flowing through the multi-layer piezoelectric element thus resulting in localized heat generation and wire breakage. The external surface of the external electrode 4 embedded in the electrically conductive adhesive also prevents cracks from occurring in the electrically conductive adhesive.

The metal mesh refers to a structure of entwined metal wires, and the mesh-like metal sheet refers to a metal sheet with a number of holes punched therethrough.

Also unless the metal mesh or mesh-like metal sheet is provided on the external surface of the external electrode 4, the external electrode 4 may peel off from the side face of the multi-layer piezoelectric element due to fatigue during the operation since the stress generated by the expansion and shrinkage of the multi-layer piezoelectric element exerts directly on the external electrode 4.

It is further preferable that the electrically conductive adhesive is polyimide resin including electrically conductive particles dispersed therein. Use of polyimide resin which has relatively high heat resistance makes it easier for the electrically conductive adhesive to maintain high bonding strength even when the multi-layer piezoelectric element is operated at a high temperature. The electrically conductive particles are preferably silver powder. This is because the use of silver powder that has relatively low specific resistance as the electrically conductive particles makes it easier to suppress localized heat generation by the electrically conductive adhesive. When silver powder that has relatively low specific resistance is dispersed in polyimide resin that has high heat resistance, the electrical conductivity assisting member 7 can be formed that maintains low resistivity and high bonding strength even when used at high temperatures.

The electrically conductive particles are preferably non-spherical particles having such shapes as flakes or acicular particles. When the electrically conductive particles are non-spherical particles such as flakes or acicular particles, the electrically conductive particles can be firmly entwined with each other, thereby increasing the shear strength of the electrically conductive adhesive.

While the multi-layer piezoelectric elements of the first and second embodiments have been described in detail, the multi-layer piezoelectric element and the method for manufacturing the same according to the present invention are not limited to the those described above, and various modifications may be made within the scope of the present invention. For example, while the metal 14 is dispersed in the inactive layer by printing the metal layer 8 on both end faces of the stack 10 provided with the inactive layers 12 and firing the stack in the case described above, the metal 14 may also be added in advance to the green sheet that forms the inactive layer 12. In case the metal 14 having melting point lower than the firing temperature of the stack 10 is dispersed, for example, the stack 10a may be placed in a crucible and fired together with the metal 14 placed nearby, so that the metal vapor released from the metal 14 is deposited on the inactive layer 12 and dispersed therein.

An example of forming the external electrodes 4 on the pair of opposing side faces of the active portion 11 has been described above, but the pair of external electrodes 4 may also be formed on a pair of adjacent side faces.

Third Embodiment

An injection apparatus according to the present invention will now be described. The injection apparatus is constituted by using the multi-layer piezoelectric element of the present invention.

Figure 6:
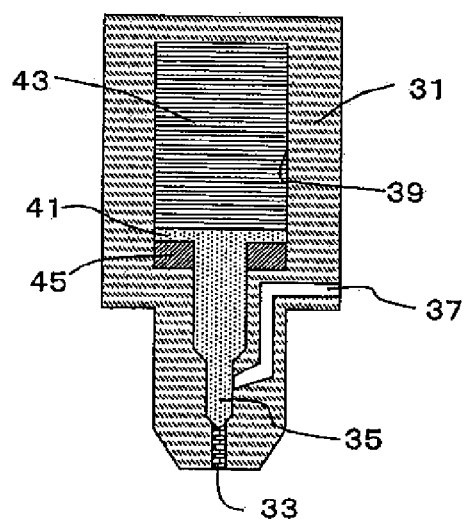
FIG. 6 is a sectional view showing a fuel injection apparatus according to the present invention.
Figure 7:
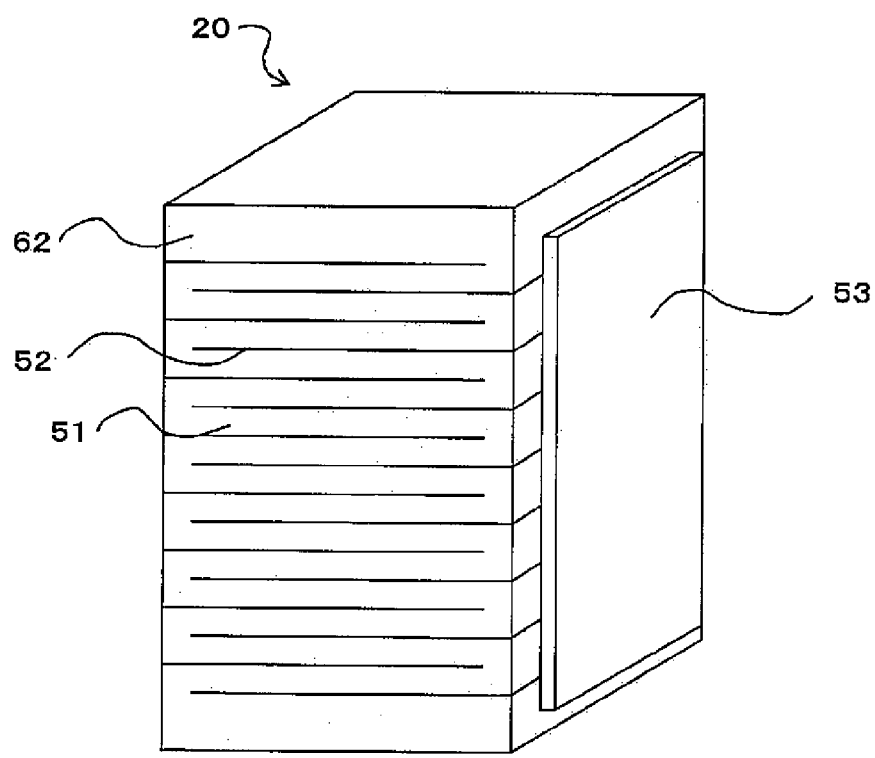
FIG. 7 is a perspective view showing the constitution of a multi-layer piezoelectric element of the prior art.

FIG. 6 shows an injection apparatus according to the present invention, where a container 31 has an injection hole 33 formed at one end thereof, and a needle valve 35 that can open and close the injection hole 33 is housed in the container 31.

The injection hole 33 is provided with a fuel passage 37 disposed in communication therewith. The fuel passage 37 is connected to a fuel source that is provided outside of the apparatus, so as to receive supply of fuel at a high pressure that remains always constant. When the needle valve 35 opens the injection hole 33, the fuel that fills the fuel passage 37 is injected at a predetermined level of high pressure into a fuel chamber of an internal combustion engine that is not shown in the drawings.

The needle valve 35 has an enlarged top portion of a larger diameter so as to serve as a piston 41 that makes sliding motion in a cylinder 39 which is formed in the container 31. The piezoelectric actuator 43 is housed in the container 31.

With the injection apparatus as described above, when the piezoelectric actuator 43 is caused to expand by a voltage applied thereto, the piston 41 is pressed so that the needle valve 35 plugs the injection hole 33 and shuts off the fuel supply. When the voltage is removed, the piezoelectric actuator 43 contracts and a Belleville spring 45 presses back the piston 41 so that the injection hole 33 communicates with the fuel passage 37 thereby allowing the fuel to be injected.

The injection apparatus of the present invention is not limited to the embodiments described above. For example, the present invention can be applied to a fuel injection apparatus of automobile engine, liquid ejecting apparatus of ink jet printer or the like or a drive unit used in precision positioning device or vibration preventing device for an optical apparatus, or to sensor devices such as a sensor element mounted in combustion pressure sensor, knocking sensor, acceleration sensor, load sensor, ultrasound sensor, pressure sensor, yaw rate sensor or the like, or used as a circuit component mounted in piezoelectric gyro, piezoelectric switch, piezoelectric transducer, piezoelectric breaker or the like, and is also applicable to other purposes, as long as the piezoelectric characteristic is utilized.

EXAMPLES

Examples of the present invention will now be described.

Example 1

As Example 1, a multi-layer piezoelectric actuator comprising the multi-layer piezoelectric element of the present invention was fabricated as described below.

First, a calcined powder of a piezoelectric ceramic material constituted from lead titanate zirconate ($PbZrO_3$—$PbTiO_3$) having a mean particle size of 0.4 µm as the main component, a binder and a plasticizer were mixed to form a slurry which was formed into ceramic green sheets that would become the piezoelectric material 1 having the thickness of 150 µm by the doctor blade process.

An electrically conductive paste, prepared by adding a binder to silver-palladium alloy (95% by weight of silver and 5% by weight of palladium) was applied to one side of the ceramic green sheet by screen printing method to the thickness of 3 µm. Then 300 pieces of the ceramic green sheets were stacked and fired at a temperature of 1000° C. after holding at 800° C.

Then a groove measuring 50 µm in depth and 50 µm in width was formed at the end of the internal electrode located on the side face of the stack in every other layer, by means of a dicing apparatus.

Then to a mixture of silver powder of flake-like particles having a mean particle size of 2 µm and amorphous glass powder having softening point of 640° C. including silicon having a mean particle size of 2 µm as the main component prepared with the composition shown in Table 1, 8 weight parts of binder and 100 weight parts in total of silver powder and glass powder were added, so as to prepare the electrically conductive silver-glass paste by fully mixing the powders. The electrically conductive silver-glass paste thus prepared was applied onto a release film by screen printing. After drying, the paste film was peeled off the release film to obtain a sheet of electrically conductive silver-glass paste.

The sheet of the silver-glass paste was transferred onto the external electrode 15 surface of the stack 13 under the conditions shown in Table 1, and was baked at 700° C. for 30 minutes, thereby forming the external electrode 15.

Then lead wires were connected to the external electrodes 15, and DC electric field of 3 kV/mm was applied between the positive and negative external electrodes 15 via the lead wires so as to apply polarization treatment for 15 minutes, thereby to complete the multi-layer piezoelectric actuator based on the multi-layer piezoelectric element as shown in FIGS. 1A, 1B.

When a DC voltage of 170 V was applied to the multi-layer piezoelectric element thus obtained, displacement of 45 µm in the stacking direction was obtained in all of the multi-layer piezoelectric actuators. Then continuous operation test was conducted on this multi-layer piezoelectric actuator by applying an AC voltage varying between 0 V and +170 V at frequency of 150 Hz at room temperature to undergo $1\times10^9$ cycles of continuous operation.

The thickness of the external electrode 15 and the content of glass therein were measured by observing a cross section under an SEM. The thickness is determined by averaging measurements taken at five points in an SEM image. The content of glass component is determined from the proportion of area occupied by the glass component in the area of the electrode layer determined by SEM and EPMA observations in terms of percentage by volume. The results are shown in Table 1.

In samples Nos. 3 through 12 which were the multi-layer piezoelectric actuators of Examples of the present invention where the external electrode was constituted from three or more layers, in contrast, effective amount of displacement required of the multi-layer piezoelectric actuator was achieved without significant decrease in the amount of displacement of the device after continuous operation of $1 \times 10^9$

TABLE 1-1

| | Constitution of external electrode | | | | | | | | | |
|---|---|---|---|---|---|---|---|---|---|---|
| | First layer | | Second layer | | Third layer | | Fourth layer | | Fifth layer | |
| No | Thickness μm | Glass content % | Thickness μm | Glass content % | Thickness μm | Glass content % | Thickness μm | Glass content % | Thickness μm | Glass content % |
| *1 | 20 | 30 | | | | | | | | |
| *2 | 10 | 50 | 10 | 10 | | | | | | |
| 3 | 5 | 50 | 10 | 30 | 10 | 10 | | | | |
| 4 | 3 | 50 | 10 | 30 | 10 | 10 | 10 | 5 | | |
| 5 | 0.5 | 70 | 10 | 30 | 10 | 10 | 10 | 1 | | |
| 6 | 1 | 80 | 10 | 30 | 10 | 10 | 10 | 2 | | |
| 7 | 2 | 70 | 10 | 30 | 10 | 10 | 10 | 2 | | |
| 8 | 3 | 60 | 10 | 30 | 10 | 30 | 10 | 10 | 10 | 2 |
| 9 | 5 | 50 | 10 | 30 | 10 | 2 | | | | |
| 10 | 5 | 70 | 10 | 30 | 10 | 2 | | | | |
| 11 | 10 | 50 | 10 | 40 | 30 | 10 | 10 | 10 | 10 | 2 |
| 12 | 2 | 70 | 20 | 30 | 10 | 2 | | | | |
| *13 | 10 | 10 | 10 | 50 | | | | | | |

Content of glass component in Table 1-1 is given in terms of volume %.

TABLE 1-2

| No | Initial displacement A (μm) | Maximum displacement after continuous operation B (μm) | Percentage change in displacement (%) |
|---|---|---|---|
| *1 | 45.0 | Destroyed from crack, peel-off of external electrode | — |
| *2 | 45.0 | Destroyed from crack, peel-off of external electrode | — |
| 3 | 45.0 | 44.7 | 0.7 |
| 4 | 45.0 | 44.8 | 0.4 |
| 5 | 45.0 | 44.9 | 0.2 |
| 6 | 45.0 | 45.0 | 0.0 |
| 7 | 45.0 | 45.0 | 0.0 |
| 8 | 45.0 | 44.8 | 0.4 |
| 9 | 45.0 | 44.7 | 0.7 |
| 10 | 45.0 | 44.7 | 0.7 |
| 11 | 45.0 | 44.6 | 0.9 |
| 12 | 45.0 | 45.0 | 0.0 |
| *13 | 45.0 | Destroyed from crack, peel-off of external electrode | — |

In Table 1-2, initial displacement A shows the displacement (μm) in the initial state, and maximum displacement after continuous operation B shows the maximum displacement (μm) after continuous operation of $1 \times 10^9$ cycles.

The percentage change in displacement in Table 1-2 shows the ratio of displacement after continuous operation to the displacement in the initial state ($|(A-B)/A \times 100|$).

From Table 1, it can be seen that, in samples Nos. 1, 2 and 13 which were Comparative Examples where the external electrode 15 was constituted from two or less layers, dimensional change of the piezoelectric layer 12 caused an increasing load on the interface between the piezoelectric layer 12 and the external electrode 15, resulting in crack in the external electrode 15 starting from the interface and peel-off in the interface, when the multi-layer piezoelectric actuator was operated continuously.

cycles, thus making it possible to manufacture the multi-layer piezoelectric actuator having high durability free from thermal excursion and malfunction.

Example 2

Percentage change in the amount of displacement was measured on each sample, by varying the composition of material making the internal electrode 2 of the multi-layer piezoelectric actuator of sample No. 7 in Example 1. The percentage change in the amount of displacement refers to the ratio of the amount of displacement (μm) of the multi-layer piezoelectric element after undergoing $1 \times 10^9$ cycles of operation to the amount of displacement (μm) of the multi-layer piezoelectric element in the initial state before starting the continuous operation. The results are shown in Table 2.

TABLE 2

| | Metals in internal electrode | | | | Percentage |
|---|---|---|---|---|---|
| No | Pd (% by weight) | Ag (% by weight) | Cu (% by weight) | Ni (% by weight) | change in displacement (%) |
| 1 | 0 | 100 | 0 | 0 | Broken |
| 2 | 0.001 | 99.999 | 0 | 0 | 0.7 |
| 3 | 0.01 | 99.99 | 0 | 0 | 0.7 |
| 4 | 0.1 | 99.9 | 0 | 0 | 0.4 |
| 5 | 0.5 | 99.5 | 0 | 0 | 0.2 |
| 6 | 1 | 99 | 0 | 0 | 0.2 |
| 7 | 2 | 98 | 0 | 0 | 0 |
| 8 | 4 | 95 | 1 | 0 | 0 |
| 9 | 5 | 95 | 0 | 0 | 0 |
| 10 | 8 | 92 | 0 | 0 | 0 |
| 11 | 9 | 91 | 0 | 0 | 0.2 |
| 12 | 9.5 | 90.5 | 0 | 0 | 0.2 |
| 13 | 10 | 90 | 0 | 0 | 0.4 |
| 14 | 15 | 85 | 0 | 0 | 0.7 |
| 15 | 0 | 0 | 100 | 0 | 0.2 |
| 16 | 0 | 0 | 99.9 | 0.1 | 0 |
| 17 | 0 | 0 | 0 | 100 | 0.4 |

TABLE 2-continued

| No | Metals in internal electrode | | | | Percentage change in displacement (%) |
|---|---|---|---|---|---|
| | Pd (% by weight) | Ag (% by weight) | Cu (% by weight) | Ni (% by weight) | |
| 18 | 20 | 80 | 0 | 0 | 0.9 |
| 19 | 30 | 70 | 0 | 0 | 0.9 |

In Table 2, metal content in the internal electrode is given in terms of percentage by weight of the metal in the total weight of the metal in the internal electrode. The percentage change in the amount of displacement is given in terms of the ratio of the amount of displacement after continuous operation to the amount of displacement in the initial state. "Broken" means destruction due to migration.

Table 2 shows that the multi-layer piezoelectric element where the internal electrode 2 was constituted from 100% silver in sample No. 1 was destroyed due to silver migration, and continuous operation was interrupted. In sample No. 18 where the metal compound of the internal electrode 2 included more than 15% by weight of group 8 to 10 metal and less than 85% by weight of group 11 metal, the internal electrode 2 had high specific resistance that resulted in heat generation during continuous operation of the multi-layer piezoelectric element, and the multi-layer piezoelectric actuator experienced a decrease in the amount of displacement.

In samples Nos. 2 through 14, in contrast, of which internal electrode 2 had such a metal composition as the proportion M1 (% by weight) of the group 8 to group 10 metal and the proportion M2 of the group 1b metal satisfied the relations $0 < M1 \leq 15$, $85 \leq M2 < 100$ and $M1 + M2 = 100$, specific resistance of the internal electrode 2 could be made lower, and heat generation in the internal electrode 2 could be suppressed during continuous operation, thus enabling it to manufacture the multi-layer piezoelectric actuator having stable amount of displacement of the device.

In samples Nos. 15 through 17, too, specific resistance of the internal electrode 2 could be made lower, so as to suppress heat generation in the internal electrode 2 during continuous operation, thus enabling it to manufacture the multi-layer piezoelectric actuator having stable amount of displacement of the device.

The present invention is not limited to the Examples described above, and various modifications may be made within the scope of the present invention.

Example 3

In Example 3, a multi-layer piezoelectric actuator comprising the multi-layer piezoelectric element according to the present invention was fabricated as follows.

First, a calcined powder of a piezoelectric ceramic material constituted from lead titanate zirconate ($PbZrO_3$—$PbTiO_3$) as the main component, a binder and a plasticizer were mixed to form a slurry which was formed into ceramic green sheets that would become the piezoelectric material 11 having the thickness of 150 µm by the doctor blade process.

An electrically conductive paste, prepared by adding a binder to the silver-palladium alloy made of an arbitrary composition, was applied to one side of the ceramic green sheet by screen printing method to the thickness of 3 µm. Then 300 pieces of the ceramic green sheets and other green sheets to make active layers were prepared. In addition, green sheets without electrically conductive paste applied thereon having the thickness of 100 µm were prepared to make the inactive layers 12. 5 to 20 green sheets for the inactive layers, 300 green sheets for the active layers and 5 to 20 green sheets for the inactive layers were stacked in this order and pressed.

Then an electrically conductive paste prepared by adding a binder to Pd, Ni, Cu, Ag, Na, Pb, W or Mo, or an electrically conductive paste prepared by adding a binder to silver-palladium alloy was applied by screen printing on both end faces of the stack 10a having the inactive layers 12 formed thereon. That is, the electrically conductive paste was applied to the end face of the inactive layer 12 to the thickness of 5 µm by screen printing, thereby forming the metal layer 8. Then after firing at 1000° C. for a predetermined period of time, the metal layer 8 was removed by means of a surface grinding machine or the like after firing.

Then a groove 3 measuring 50 µm in depth and 50 µm in width was formed at the end of the internal electrode located on the side face of the stack in every other layer, by means of a dicing apparatus, and the groove 3 was filled with a silicone rubber that was then hardened.

Then to a mixture of 90% by volume of silver powder consisting of flake-like particles having a mean particle size of 2 µm and 10% by volume of amorphous glass powder having softening point of 640° C. including silicon having a mean particle size of 2 µm as the main component, 8 weight parts of binder and 100 weight parts in total of silver powder and glass powder were added, so as to prepare the electrically conductive silver-glass paste by fully mixing the powders. The electrically conductive silver-glass paste thus prepared was applied onto a release film by screen printing. After drying, the paste film was peeled off the release film to obtain a sheet of electrically conductive silver-glass paste. Density of the green sheet was measured by Archimedes method, and a value of 6.5 g/cm³ was obtained.

The sheet of the silver-glass paste was transferred onto the external electrode surface of the stack, and was baked at 650° C. for 30 minutes, thereby forming the external electrode from a porous electrical conductor having 3-dimensional mesh structure. Measurement of the void ratio of the external electrode by analyzing a cross section of the external electrode with an image analysis apparatus showed a value of 40%. A powder of $K_2CO_3$ or $Na_2CO_3$ was added to the stock materials for the piezoelectric layer 1, the internal electrode 2 and the external electrode 4. Alkali metals included in the piezoelectric layer, the internal electrode and the external electrode that were sintered were detected by ICP analysis.

Figure 8:
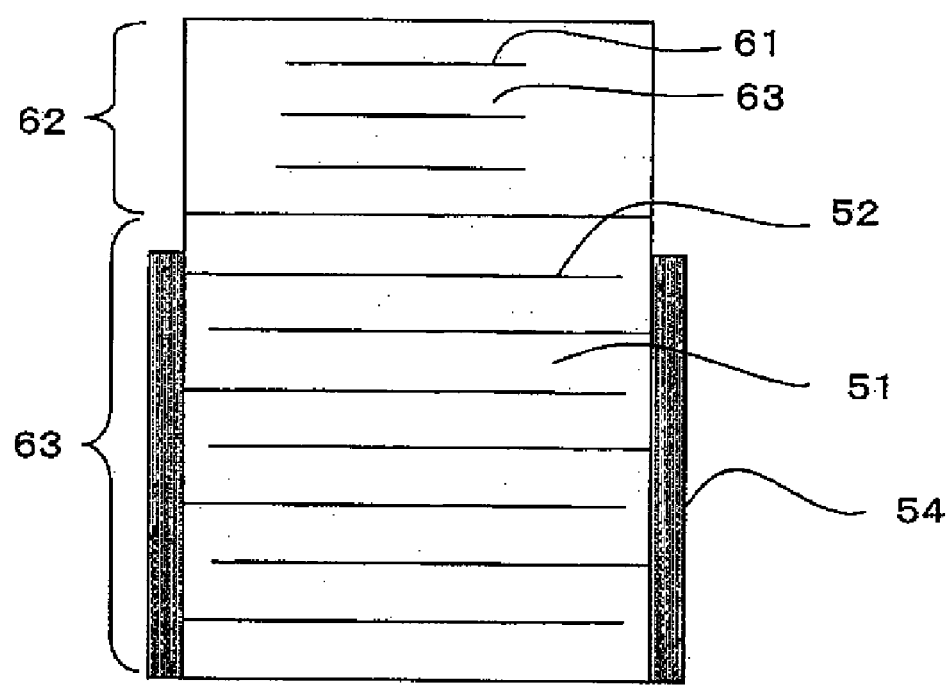
FIG. 8 is a sectional view showing the constitution of a multi-layer piezoelectric element of the prior art, different from that shown in FIG. 7.

As Comparative Example, multi-layer piezoelectric element was made having such a constitution as shown in FIG. 8 where an electrode not in electrical continuity with the external electrode was formed on the inactive layer. The piezoelectric layer of the multi-layer piezoelectric element had a composition similar to that of the present invention, and the internal electrode of Comparative Example had a composition of silver and palladium contained in proportions of 95:5. In Table 3-1, columns of ratio of melting point of the dispersed metal and composition of the dispersed metal are left blank (-) for sample No. 1 of Comparative Example since the inactive layer did not include metal dispersed therein. 10 sheets for the inactive layer, 300 sheets for the active layer and 10 sheets for the inactive layer were stacked in this order, and multi-layer piezoelectric element was completed by providing the external electrodes and the lead wires similarly to the method of the present invention (sample No. 1 in Table 3).

Then the lead wires 6 were connected to the external electrodes 4, and DC electric field of 3 kV/mm was applied between the positive and negative external electrodes 4 via the lead wires 6 so as to apply polarization treatment for 15 minutes, thereby to complete the multi-layer piezoelectric actuator based on the multi-layer piezoelectric element as shown in FIGS. 3A, 3B.

When a DC voltage of 170 V was applied to the multi-layer piezoelectric actuator thus obtained, displacement of 45 μm in the stacking direction was obtained. Then continuous operation test was conducted on this multi-layer piezoelectric element by applying an AC voltage varying between 0 V and +170 V at frequency of 150 Hz at room temperature.

After subjecting the multi-layer piezoelectric element to continuous operation to undergo $1 \times 10^9$ cycles of operation, the number of devices that failed was taken as the failure ratio. Whether the metal 14 was dispersed in the inactive layer 12 or not was determined by analyzing a cross section of the inactive layer 12 at 3 points by EPMA. The content of the metal 14 dispersed in the inactive layer 12 was analyzed by ICP emission analysis on test pieces taken out of the inactive layer 12 at arbitrarily selected three points, and mean value was taken from the measurements. The results are shown in Table 3. The ratio of the melting point of the metal dispersed to the firing temperature shown in Table 3 means the ratio of the melting point of the metal to the firing temperature of the stack 10a.

TABLE 3

| No | Dispersion of metal | Ratio of the melting point of dispersed metal to firing temperature (%) | Composition of dispersed metal |
|---|---|---|---|
| *1 | None | — | — |
| 2 | Yes | 218 | W |
| 3 | Yes | 282 | Mo |
| 4 | Yes | 130 | Pd |
| 5 | Yes | 120 | Ni |
| 6 | Yes | 90 | Cu |
| 7 | Yes | 80 | Ag |
| 8 | Yes | 73 | Na |
| 9 | Yes | 27 | Pb |
| 10 | Yes | 80, 130 | 99.99Ag—0.01Pd |
| 11 | Yes | 80, 130 | 95Ag—5Pd |
| 12 | Yes | 80, 130 | 90Ag—10Pd |
| 13 | Yes | 80, 130 | 85Ag—15Pd |
| 14 | Yes | 80, 130 | 95Ag—5Pd |
| 15 | Yes | 80, 130 | 95Ag—5Pd |
| 16 | Yes | 80, 130 | 95Ag—5Pd |
| 17 | Yes | 80, 130 | 95Ag—5Pd |
| 18 | Yes | 80, 130 | 95Ag—5Pd |
| 19 | Yes | 80, 130 | 95Ag—5Pd |
| 20 | Yes | 80, 130 | 95Ag—5Pd |
| 21 | Yes | 80, 130 | 95Ag—5Pd |

| No. | Composition of internal electrode | Content of dispersed metal (% by weight) | Thickness of inactive layer (mm) | Failure rate after continuous durability test (%) |
|---|---|---|---|---|
| *1 | 95Ag—5Pd | 0 | 0.5 | 9 |
| 2 | 95Ag—5Pd | 0.0001 | 0.5 | 3 |
| 3 | 95Ag—5Pd | 0.0002 | 0.5 | 4 |
| 4 | 95Ag—5Pd | 0.03 | 0.5 | 0.7 |
| 5 | 95Ag—5Pd | 0.03 | 0.5 | 0.8 |
| 6 | 95Ag—5Pd | 0.08 | 0.5 | 0.8 |
| 7 | 95Ag—5Pd | 0.06 | 0.5 | 0.4 |
| 8 | 95Ag—5Pd | 0.09 | 0.5 | 0.6 |
| 9 | 95Ag—5Pd | 0.03 | 0.5 | 0.9 |
| 10 | 99.99Ag—0.01Pd | 0.1 | 0.5 | 0.07 |
| 11 | 95Ag—5Pd | 0.1 | 0.5 | 0.05 |
| 12 | 90Ag—10Pd | 0.1 | 0.5 | 0.06 |
| 13 | 85Ag—15Pd | 0.1 | 0.5 | 0.07 |
| 14 | 95Ag—5Pd | 0.001 | 0.5 | 0.5 |
| 15 | 95Ag—5Pd | 0.01 | 0.5 | 0.3 |
| 16 | 95Ag—5Pd | 0.1 | 0.5 | 0.05 |
| 17 | 95Ag—5Pd | 1.2 | 0.5 | 1.2 |
| 18 | 95Ag—5Pd | 0.1 | 0.1 | 0.06 |
| 19 | 95Ag—5Pd | 0.1 | 0.1 | 0.05 |
| 20 | 95Ag—5Pd | 0.1 | 1.0 | 0.05 |
| 21 | 95Ag—5Pd | 0.1 | 2.0 | 0.05 |

From Table 3, it can be seen that, in the multi-layer piezoelectric actuator of sample No. 1 which was Comparative Example, crack occurred in the interface between the electrode of the inactive layer and the active portion due to the stress generated by the vibration of the multi-layer piezoelectric element during the continuous operation test, thus resulting a high failure rate, since the electrode was provided to the internal layer.

In samples Nos. 2 through 21 which were the multi-layer piezoelectric actuators of Example 3 of the present invention, stress generated between the inactive layer 12 and the active portion 11 due to shrinkage during firing was mitigated and equalized since the metal was dispersed in the inactive layer 12, and cracks and other defects were suppressed from occurring in the inactive layer 12 even when used continuously over a long period of time under a high voltage, thus resulting in higher durability and lower failure rate.

In samples Nos. 2, 3, it was difficult for the metal 14 to disperse in the inactive layer 12 since the melting point of the metal that constituted the electrode layer 8 was markedly higher than the firing temperature of the stack 10a, thus the effects described above could not be sufficiently achieved.

In sample No. 17, the inactive layer 12 underwent insulation breakdown due to deteriorating insulation property, since the content of the metal 14 dispersed in the inactive layer 12 exceeded 1.0% by weight, thus resulting in somewhat higher failure rate.

In samples Nos. 4 through 16 and 18 through 21, in contrast, the effects described above could be easily achieved since the content of the metal 14 dispersed in the inactive layer 12 was in a range from 0.001 to 1.0% by weight. In samples Nos. 11 through 13, 16 and 18 through 21 where the content of the metal 14 dispersed in the inactive layer 12 was 0.1% by weight and the metal 14 was constituted from silver and palladium, namely the metal 8 included the metal that constituted the internal electrode 2, in particular, the inactive layer 12 maintained the insulation property and the metal 14 was easily dispersed in the inactive layer 12. As a result, cracks and other defects were suppressed from occurring in the inactive layer 12 even when used continuously over a long period of time under a high voltage, thus resulting in higher durability and significantly lower failure rate.

The invention claimed is:

1. A multi-layer piezoelectric element comprising:
a stack having an active portion constituted from at least one piezoelectric layer and a plurality of internal electrodes consisting of the first and the second internal electrodes placed one on another, the active portion being subjected to expansion and contraction in response to a voltage applied across the first internal electrode and the second internal electrode; and
external electrodes formed on two side faces of the stack, one of said external electrodes being connected to the first internal electrode and the other of said external electrodes being connected to the second internal electrode,
wherein each of the external electrodes has three or more layers including a first layer containing a metal oxide and formed in contact with the side face of the stack, a second layer containing a metal oxide and formed on the first layer, and an outermost layer containing a metal oxide, wherein a content of the metal oxide in the first layer is more than a content of the metal oxide in the second layer, and the content of the metal oxide in the second layer is more than a content of the metal oxide in the outermost layer.

2. The multi-layer piezoelectric element according to claim 1, wherein a thickness of the first layer is 10 µm or less.

3. The multi-layer piezoelectric element according to claim 1, wherein the metal oxide is a glass and the glass component is dispersed in the grain boundaries of a metal component that constitutes the external electrode.

4. The multi-layer piezoelectric element according to claim 1, wherein the stack has inactive layers made of a piezoelectric material located on both ends, the inactive layers including dispersed metal.

* * * * *